United States Patent
Dinn et al.

(10) Patent No.: US 6,882,236 B2
(45) Date of Patent: Apr. 19, 2005

(54) DYNAMICALLY TUNED AMPLIFIER FOR FREQUENCY SHIFT KEYED SIGNALS

(75) Inventors: Don Dinn, Dartmouth (CA); Gordon Evan Locke, Porter's Lake (CA)

(73) Assignee: Magneto-Inductive Systems Limited, Nova Scotia (CA)

( * ) Notice: Subject to any disclaimer, the term of this patent is extended or adjusted under 35 U.S.C. 154(b) by 4 days.

(21) Appl. No.: 10/637,990

(22) Filed: Aug. 8, 2003

(65) Prior Publication Data

US 2004/0085145 A1 May 6, 2004

Related U.S. Application Data

(63) Continuation-in-part of application No. 10/288,711, filed on Nov. 5, 2002, now Pat. No. 6,720,838.

(51) Int. Cl.$^7$ ................................................. H03B 5/14
(52) U.S. Cl. ........................ 331/138; 331/1 R; 331/110; 331/117 R
(58) Field of Search ................................. 331/1 R, 1 A, 331/36 C, 110, 138, 139, 177 R, 179

(56) References Cited

U.S. PATENT DOCUMENTS

| | | |
|---|---|---|
| 3,569,836 A | 3/1971 | Deen |
| 3,898,582 A | 8/1975 | Deming |
| 3,935,534 A | 1/1976 | Lewis et al. |
| 4,058,742 A | 11/1977 | O'Brien |
| 4,615,041 A | 9/1986 | Koskinen |
| 5,287,112 A | 2/1994 | Schuermann |
| 5,550,536 A | 8/1996 | Flaxl |
| 5,698,838 A * | 12/1997 | Yamaguchi .................. 235/492 |
| 5,999,857 A | 12/1999 | Weijand et al. |
| 6,002,256 A | 12/1999 | Slade |
| 6,255,913 B1 | 7/2001 | Wang |
| 6,317,027 B1 | 11/2001 | Watkins |
| 6,570,370 B2 * | 5/2003 | Tupper et al. ............... 323/293 |
| 6,650,870 B2 * | 11/2003 | White et al. ................ 273/237 |
| 6,720,838 B2 * | 4/2004 | Locke ..................... 331/177 R |

FOREIGN PATENT DOCUMENTS

GB     2207837     7/1988

* cited by examiner

*Primary Examiner*—David Mis
(74) *Attorney, Agent, or Firm*—Townsend and Townsend and Crew LLP

(57) ABSTRACT

An amplifier circuit for efficiently driving a tuned resonant load where the amplifier circuit controls the continuously variable resonant frequency of the tuned resonant load so as to match step changes or slower changes in the frequency of the signal with which it is being driven. The circuit includes a tuned resonant load, a driver, a controller and a feedback loop. The driver is coupled to the load and drives it with a driving signal at a frequency under the control of the controller. The controller dynamically controls the resonant frequency of the tuned resonant load in response to an error signal received through the feedback loop. The error signal represents the mismatch in phase between the resonant phase of the load current and the phase of the driving signal, or between the resonant phase of the tuning capacitor voltage offset by 90 degrees and the phase of the driving signal. The controller also controls the pulse width of the driving signal, which controls the energy transferred to the load, and ensures the pulses are centered within the half-cycle of the load current to avoid advancing or retarding the phase of the load current in each half cycle.

34 Claims, 9 Drawing Sheets

DYNAMICALLY TUNED AMPLIFIER FOR FREQUENCY SHIFT KEYED SIGNALS

CROSS-REFERENCE TO RELATED APPLICATIONS

This application is a continuation-in-part of U.S. patent application Ser. No. 10/288,711 filed Nov. 5, 2002 now U.S. Pat. No. 6,720,838, the complete disclosure of which is herein incorporated by reference.

FIELD OF INVENTION

The present invention relates to an amplifier circuit for driving a continuously tunable resonant load.

BACKGROUND OF THE INVENTION

When a highly reactive tuned load is driven by a signal at a variable frequency, especially a frequency shift keyed (FSK) signal, the output current will be limited if the resonant frequency of the tuned load does not match the frequency of the drive signal. Significant energy can also be wasted if the phase of the energy in the tuned load for a particular bit is not synchronous with the phase of the input signal for a subsequent bit, i.e. at the bit transitions.

There are many applications in which it may be desirable to drive a narrow-bandwidth tuned load with an amplified FSK signal, such as in the generation and modulation of AC magnetic fields by transmitter. Such fields are used in magnetic inductive systems, which are employed for purposes of navigation, communication, signaling, direction finding and other applications.

The quasi-static AC magnetic fields used in magneto-inductive systems are typically generated by driving a low-frequency AC current through a tuned antenna formed from electromagnetic loop coils or a solenoid. Power losses are minimized by ensuring that the antenna load is a high-Q load. This has the effect of making the antenna load a highly-tuned narrow-bandwidth load, thereby making it difficult to drive effectively unless the resonant frequency of the load is matched precisely to the frequency of the drive signal, and the phase of the load current is not discontinuous with respect to the phase of the drive signal. When the drive signal has a variable frequency, such as in the case of an FSK drive signal, difficulties arise in ensuring that the resonant frequency of the load precisely tracks the frequency changes of the drive signal at bit transitions. Additionally, changes in tuning components versus temperature, for example, can cause detuning of the load as the ambient temperature changes.

SUMMARY OF THE INVENTION

The present invention provides a switching amplifier that drives a tuned load with a driving signal at a variable drive level and a variable frequency and dynamically tunes the load to ensure the resonant frequency of the load matches the frequency of the drive signal in step with any frequency transitions, thereby providing for efficient power transfer to the load.

In one aspect, the present system provides a circuit that includes a tunable resonant load containing a load energy having a load phase, a driver coupled across the tunable resonant load to apply a drive signal having a drive phase to the tunable resonant load to supply the load energy, a controller coupled to the tunable resonant load and coupled to the driver, the controller including a first component for controlling the drive phase of the drive signal and a second component for tuning the tunable resonant load, and a feedback loop coupled between the tunable resonant load and the controller, the feedback loop generating an error signal in response to a phase deviation between the drive phase and the load phase, wherein, in response to the error signal, the second component generates a tuning signal for tuning the tunable resonant load.

In another aspect, the present invention provides a method of driving a tunable resonant load with an amplifier using a drive signal having a driving phase, the tunable resonant load containing a load energy having a load phase. The method includes the steps of applying the drive signal to the tunable resonant load, measuring a phase difference between the drive phase of the drive signal and the load phase of the load energy, generating an error signal based upon the phase difference, and tuning the tunable resonant load in response to the error signal.

Other aspects and features of the present invention will become apparent to those ordinarily skilled in the art upon review of the following description of specific embodiments of the invention in conjunction with the accompanying figures.

BRIEF DESCRIPTION OF THE FIGURES

Reference will now be made, by way of example, to the accompanying drawings which show embodiments of the present invention, and in which.

Similar reference numerals are used in different Figures to denote similar components.

DETAILED DESCRIPTION OF AN EMBODIMENT

Figure 1:
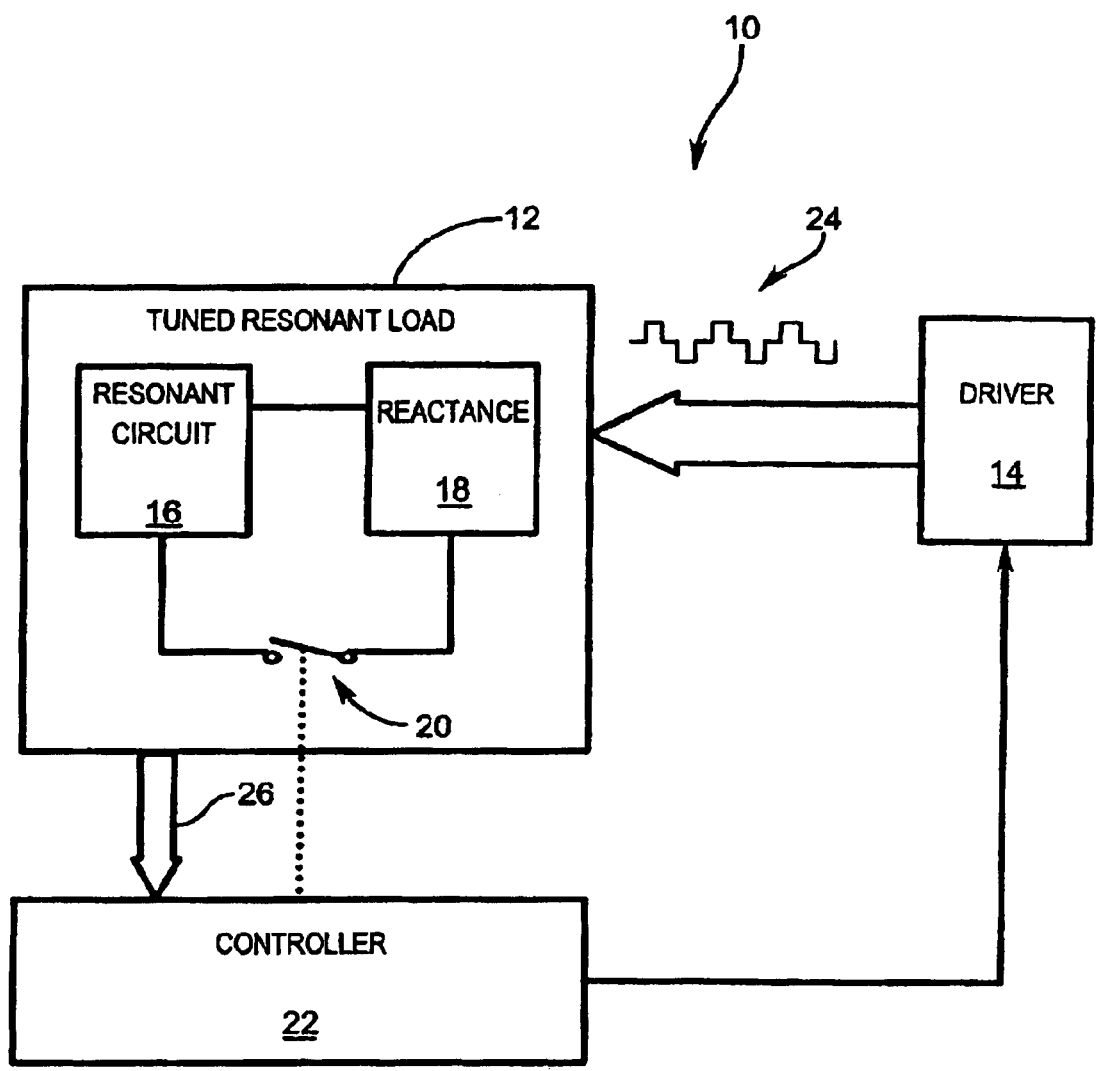
FIG. 1 shows a block diagram of a dynamically tuned amplifier according to the present invention.

Reference is first made to FIG. 1, which shows a block diagram of an amplifier 10 according to the present invention. The amplifier 10 includes a tuned resonant load 12 driven by a driver 14. The tuned resonant load 12 includes a resonant circuit 16 having a resonant frequency determined by the reactive components contained in the resonant circuit 16. The tuned resonant load 12 also includes a reactance 18 and a switch 20 coupled to the resonant circuit 16. When the switch 20 is closed, the reactance 18 is coupled to the resonant circuit 16 thereby changing its reactance and, thus, its resonant frequency.

The tuned resonant load 12 is continuously tunable through a range of frequencies between the resonant frequency of the resonant circuit 16 on its own, through to the resonant frequency of the resonant circuit 16 when it is coupled to the reactance 18. To obtain a tuned resonant load 12 having a continuously variable resonant frequency, the reactance 18 is coupled to the resonant circuit 16 for a symmetrical portion of a quarter-cycle at the beginning and preceding the end of each half-cycle of the oscillating frequency. The portion may vary from zero to a full quarter-cycle. Such a method and apparatus for obtaining a tuned resonant load 12 with a continuously variable resonant frequency is detailed below with reference to FIGS. 6 through 10.

The driver 14 supplies power to the tuned resonant load 12 to drive its load current. For maximum efficiency, the resonant frequency of the tuned resonant load 12 should match the frequency of a drive signal supplied by the drive 14. Drive signals that are not at the resonant frequency of the tuned resonant load 12 will be only partially effective in delivering current to the tuned resonant load 12. Additionally, the phase of the load current and of the drive signal should be the same for achieving maximum load current in the tuned resonant load 12. Furthermore, at step changes in the frequency of an FSK drive signal, the tuned frequency of the tuned resonant load 12 and the phase of the load current should match the frequency and phase of the FSK drive signal.

In one embodiment, the driver 14 supplies energy by way of a bipolar pulsed voltage signal 24. Because the tuned resonant load 12 is a highly tuned circuit, i.e. a high-Q circuit, the harmonics of load current are significantly attenuated leaving a substantially sinusoidal waveform for the load current. Accordingly, the harmonics of the bipolar pulsed voltage signal 24 are filtered by the tuned resonant load 12 resulting in a predominantly sinusoidal load current at the fundamental frequency.

The switch 20 and the driver 14 operate in response to a controller 22. The controller 22 coordinates the opening and closing of the switch 20 so as to appropriately tune the tuned resonant load 12 to a particular resonant frequency for each half cycle. The controller 22 also controls the driver 14, including setting the frequency of the bipolar pulsed voltage signal 24 and controlling the pulse width of the bipolar pulsed voltage signal 24. By controlling the pulse width, the controller 22 controls the quantity of energy supplied to the tuned resonant load 12. To prevent pulling or pushing the oscillation frequency (i.e., retarding or advancing the phase angle) of the tuned resonant load 12, the controller 22 includes a function or routine in its firmware that ensures that the driver 14 centers each positive and negative voltage pulse in the half cycle of the tuned resonant load 12 current. In order to ensure this centering occurs, the controller 22 includes a function or routine that tunes the resonant frequency of the tuned resonant load 12, so that its resonant frequency matches the frequency and phase of the bipolar pulsed voltage signal 24 with which it is being driven.

The controller 22 receives information through a feedback loop 26 from the tuned resonant load 12, upon which it may make adjustments to its control of the switch 20, thereby fine-tuning the resonant frequency of the tuned resonant load 12. The feedback information 26 may include voltage or current zero crossings from various points in the tuned resonant load 12 or other indicators of phase or frequency.

The controller 22 may be implemented using a microcontroller suitably programmed to execute a program in firmware to perform the functions, calculations and routines described herein. It may also be implemented using oscillators, comparators and various other logic circuits and discrete components, or a combination of such components and a microcontroller. Other methods of implementing the various controller 22 functions will be apparent to one of ordinary skill in the art in light of the description herein.

Figure 2:
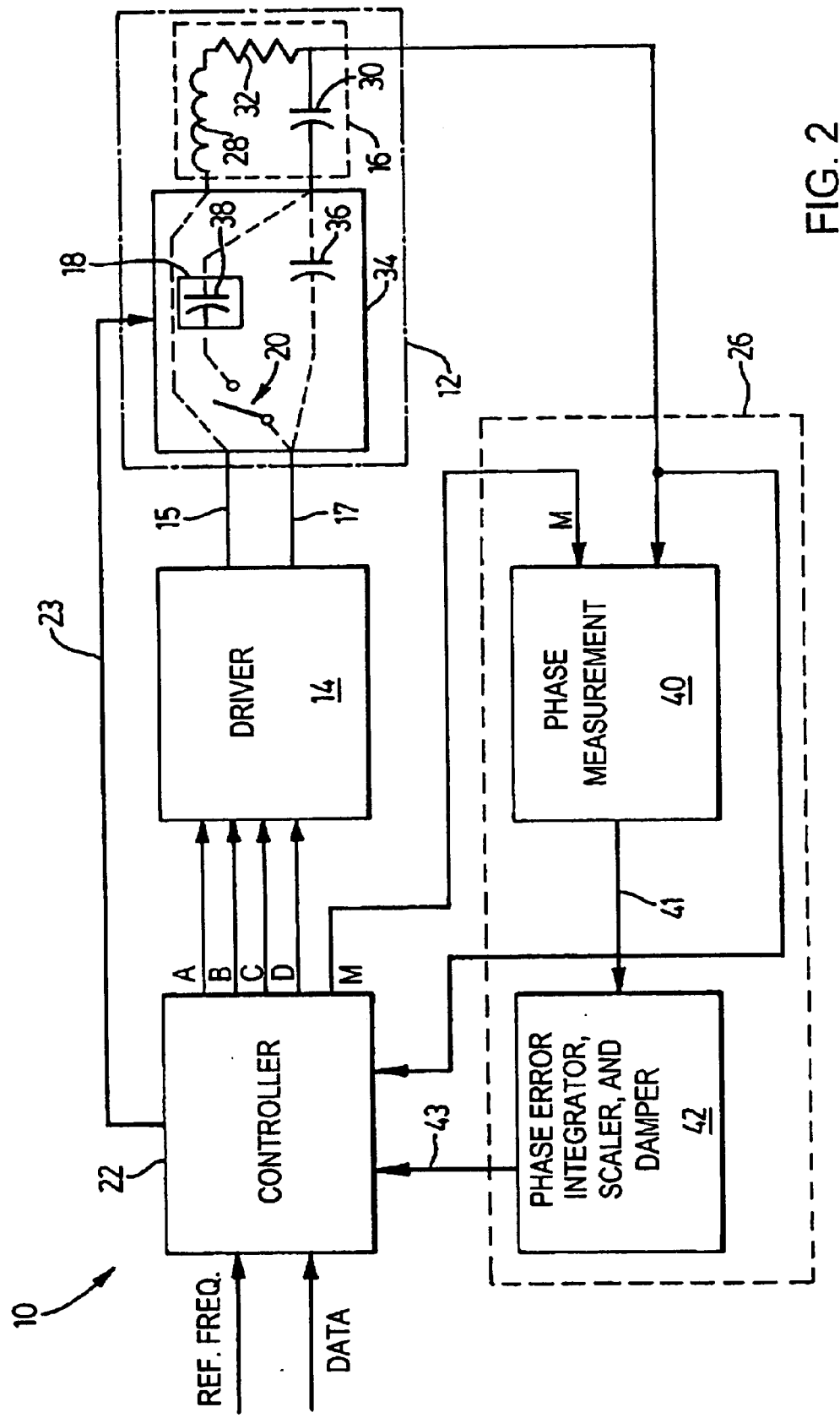
FIG. 2 shows a more detailed block diagram of the dynamically tuned amplifier according to the present invention.
Figure 4:
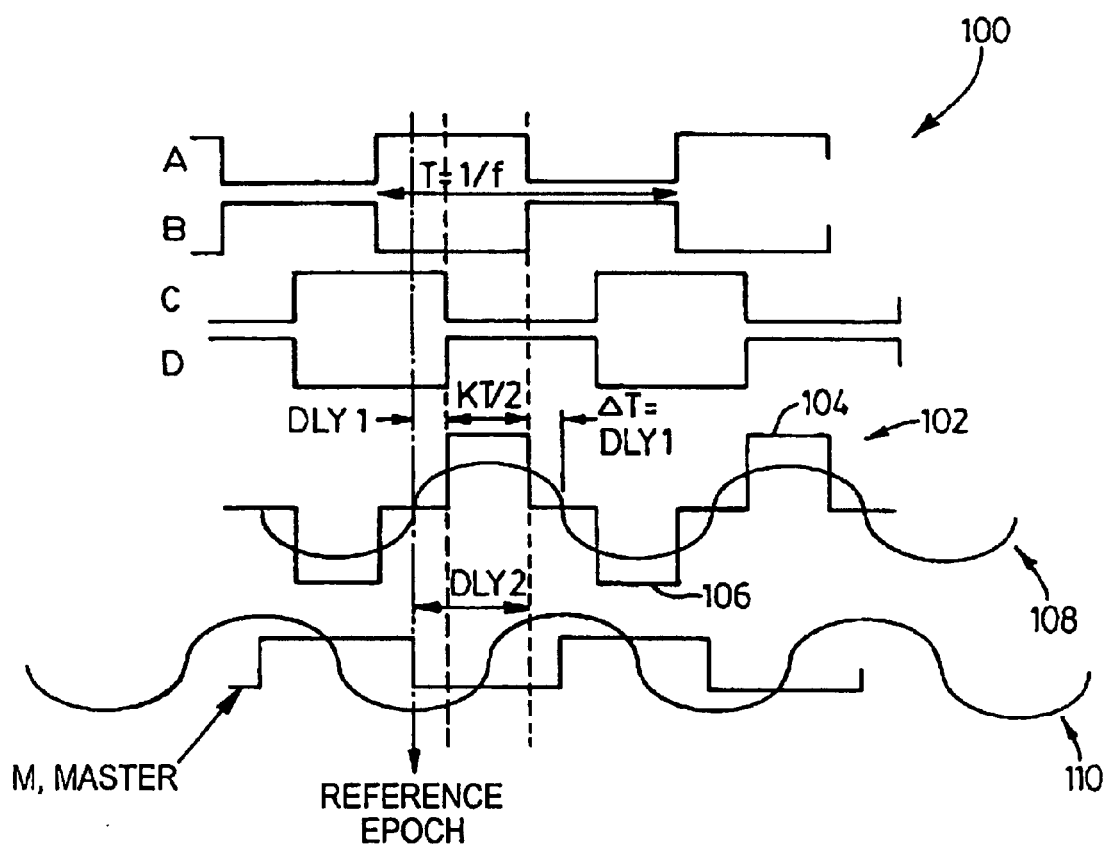
FIG. 4 shows a timing diagram for signals at certain points in the circuit shown in FIG. 3.

Reference is now made to FIG. 2, which shows a more detailed block diagram of an embodiment of the dynamically tuned amplifier 10 according to the present invention, and to FIG. 4, which shows exemplary timing diagrams for various signals in the amplifier 10.

The amplifier 10 includes the tuned resonant load 12 and the driver 14, which, in this embodiment, is a full-bridge configured driver. The driver 14 includes a left-side drive-point H1 and a right-side drivepoint H2 that are coupled to the tuned resonant load 12. The driver 14 operates in a push-pull mode as each of the two sides H1 and H2 are alternately driven with complementary pulse signals.

The tuned resonant load 12 includes the resonant circuit 16 which includes an inductive coil 28 in series with a base capacitance 30. The inductive coil 28 and other elements of the tuned resonant load 12 will include a certain amount of resistive impedance, shown as resistor 32.

The tuned resonant load 12 further includes a tuning apparatus 34. The tuning apparatus 34 includes a second capacitor 36 in series with the base capacitor 30. The tuning apparatus also includes the switch 20 and the reactance 18, which in this embodiment is a tuning capacitor 38. The combination of the switch 20 and the tuning capacitor 38 are connected in parallel with the second capacitor 36. The ratios of the capacitors 38, 36, and 30 determine the tuning range.

In this configuration, if the switch 20 is open, the resonant frequency of the tuned resonant load 12 is an upper frequency, which is determined by the inductive coil 28, the base capacitor 30 and the second capacitor 36. If the switch 20 is closed, then the resonant frequency of the tuned resonant load 12 is a lower frequency, which is determined by the foregoing elements plus the tuning capacitor 38. If the switch 20 is only closed for a portion of a quarter-cycle at the beginning and end of each half-cycle of the resonant voltage across the tuning capacitor 38, then the resonant frequency of the tuned resonant load 12 will be between the lower frequency and the upper frequency and will be adjustable through varying the duration of the portion, as detailed below with reference to FIGS. 6 through 10. Accordingly, the tuned resonant load 12 has a continuously variable resonant frequency, the value of which is determined by the controller's 22 operation of the switch 20.

The driver 14 receives digital FSK signals A, B, C, and D from the controller 22. The controller 22 generates the FSK signals A, B, C, and D at the appropriate bit rate and frequency for controlling each quarter of the full-bridge driver 14. Exemplary waveforms for the FSK signals A, B, C, and D are shown in FIG. 4 and are described in greater detail below. The FSK signals A, B, C, and D determine the complementary pulse signals produced at the two side drivepoints H1 and H2 of the driver 14. The complementary pulse signals at the two drivepoints H1 and H2 result in a bipolar pulsed drive voltage across the bridge.

The signal generating aspect of the controller 22 may be implemented by an oscillator and tuning and logic circuits. It may also be implemented through a program or module for execution by a microprocessor or other means, as will be understood by those of ordinary skill in the art.

The controller 22 receives a reference frequency signal from which the frequency of the FSK signals A, B, C, and D may be derived and a data signal. The data signal contains the binary information with which the FSK signals A, B, C, and D are modulated. The binary FSK signals A, B, C, and D are generated at either a first frequency or at a second frequency, depending upon whether the data signal indicates a zero or a one.

In addition to generating the FSK signals A, B, C, and D for controlling the driver 14, the controller 22 generates a capacitor switch signal 23 for controlling the opening and closing of the switch 20 in the tuning apparatus 34. Through the capacitor switch signal 23, the controller 22 controls the resonant frequency of the tuned resonant load 12. The controller 22 adjusts the resonant frequency of the tuned resonant load 12 to dynamically match the frequency of the FSK signals A, B, C and D, and, accordingly, the fundamental frequency of the bipolar pulsed drive voltage for driving the tuned resonant load 12. In this manner, the controller 22 ensures that the driver 14 drives the tuned resonant load 12 efficiently to achieve the desired load current by driving the load 12 with an input frequency to which the resonant frequency of the tuned resonant load 12 is matched. Moreover, as the driving frequency changes during bit transitions in the FSK signal, the controller 22 alters the resonant frequency of the tuned resonant load 12 to dynamically track the frequency of the drive signal and to maintain the phase of the load current and the phase of the drive signal the same within a small error.

The controller 22 may be provided with a memory that stores preset capacitor switch signal 23 settings for particular driving frequencies, enabling the controller 22 to rapidly adjust the resonant frequency of the tuned resonant load 12 at bit transitions and then rely upon the feedback loop 26 to make any subsequent fine tuning adjustments to compensate for component drift in the tuned resonant load 12. The settings stored in the memory may be updated periodically, such as at each bit transition, to reflect the most recent capacitor switch signal 23 setting for a particular driving frequency.

The controller 22 also generates a master signal M, which is a digital FSK square wave with a 50% duty cycle during each bit interval. An exemplary waveform for the master signal M is also depicted in FIG. 4. The master signal M contains the desired FSK frequency shifts derived from the bit changes in the data signal. The master signal M is related to the FSK signals A, B, C, and D in that those latter signals determine the bipolar pulsed drive voltage across the bridge and the master signal M has zero crossings centered between each pair of bipolar pulses. The master signal M is 180 degrees out of phase with the drive voltage across the bridge. The controller 22 ensures that the current in the tuned resonant load 12 is in phase with the bipolar pulsed drive voltage. Accordingly, the master signal M will also be 180 degrees out of phase with the current in a load that is tuned to resonance. As a proxy for load current phase, the phase of the voltage across the tuning capacitor 38 will lag the current by 90 degrees, meaning that it will lead the master signal M by 90 degrees when the frequency of the tuned resonant load 12 is tuned to match the frequency of the drive signal. The master signal M serves as a reference phase for comparison with the phase of the capacitor voltage in a phase comparator 40 whose mid-control-point occurs at a 90 degree phase difference at its inputs.

The phase comparator 40 produces a signed phase error signal 41. The phase error signal 41 is centered upon a desired 90 degree phase difference. Each half-cycle, the phase of the voltage across the capacitors 30, 36 or 38 is compared with the phase of the master signal M. If the phase differs by more than or less than 90 degrees, the signed phase error signal 41 indicates the level of phase advance or retard.

The phase error signal 41 is input into a feedback generator 42, which includes an integrator and a gain block. The integrator and gain block implement a scaling and damping function for smoothing out the phase error signal 41 and generating a delay control signal 43. The delay control signal 43 is input into the controller 22, which uses the delay control signal 43 to determine in appropriate capacitor switch signal 23 in order to tune the tuned resonant load 12, so as to minimize the phase error.

The phase comparator 40 and feedback generator 42 may be implemented using discrete components, discrete logic devices, a suitably programmed microprocessor, or through other means. They may also be implemented as a part of the controller 22 using a microcontroller or microprocessor. The parameters of the functions may be determined in conjunction with the natural time constant of the tuned resonant load 12 to ensure rapid settling of the load current when the driver 14 is activated.

Figure 3:
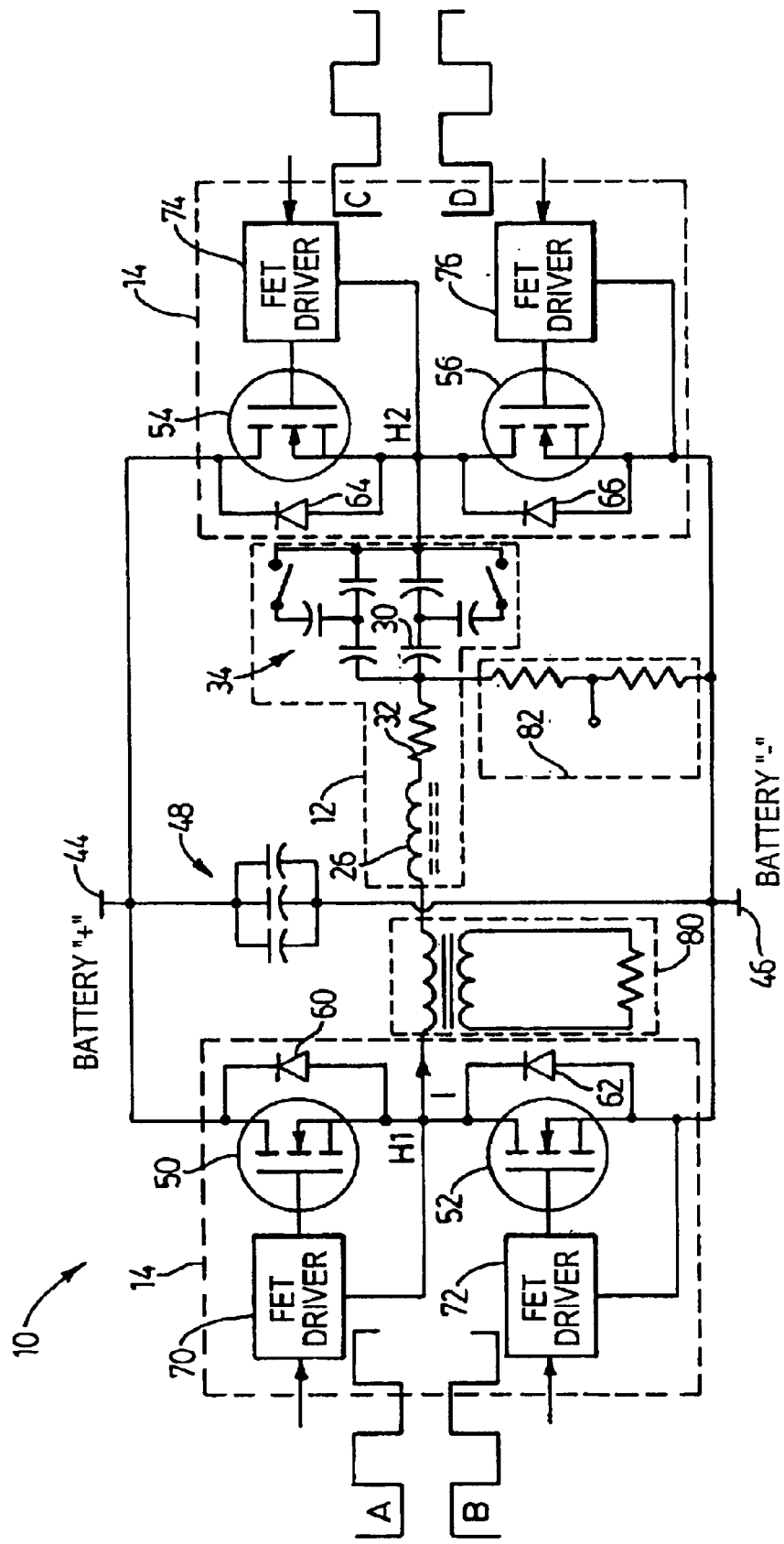
FIG. 3 shows a circuit for a full-bridge embodiment of the dynamically tuned amplifier according to the present invention.

Reference is next made to FIGS. 3 and 4. FIG. 3 shows a circuit for a full-bridge embodiment of the dynamically tuned amplifier 10. FIG. 4 shows an exemplary timing diagram 100 for certain signals in the amplifier 10 shown in FIG. 3.

As can be seen from FIG. 3, the driver 14 includes a left upper switch, a left lower switch, a right upper switch, and a right lower switch. In this embodiment, the four switches are most readily implemented using a left upper MOSFET 50, a left lower MOSFET 52, a right upper MOSFET 54, and a right lower MOSFET 56, respectively, all of them being N-channel devices. In other embodiments, the switches may be implemented using integrated gate bipolar junction transistors, P and N-channel MOSFETs with appropriate drivers, relays or other switching mechanisms selected to be appropriate for the current and voltage to be delivered to the tuned resonant load 12.

Each MOSFET 50, 52, 54 and 56, is coupled to a respective FET driver 70, 72, 74 and 76. The source of the left upper MOSFET 50 is connected to the drain of the left lower MOSFET 52 to form the left side of the driver 14. Similarly, the source of the right upper MOSFET 54 is connected to the drain of the right lower MOSFET 56 to the form the right side of the driver 14. Accordingly, the left drivepoint H1 of the driver 14 is between the two left MOSFETs 50, 52 and the right drivepoint H2 of the driver 14 is between the two right MOSFETs 54, 56. Connected between the two drivepoints H1, H2 is the tuned resonant load 12 to be driven by the driver 14. In this embodiment, the tuned resonant load 12 includes the resonant circuit 16 together with the tuning apparatus 34.

The drain of the left upper MOSFET 50 and the drain of the right upper MOSFET are both connected to a positive rail 44 of the DC power source for the amplifier 10. The sources of the two lower MOSFETs 54, 56 are connected to a negative rail 46 of the power source.

In full power operation, each side of the driver 14 is driven in a push-pull mode with complementary square-wave signals. The FET drivers 70, 72, 74, and 76 receive input signals A, B, C, and D, respectively. Input signals A and B are complimentary such that only one of the left side MOSFETs 50, 52 is on at a time. Similarly, input signals C and D are complimentary such that only one of the right side MOSFETs 54, 56 is on at a time. For operation, input signals A and D are in phase, such that when the left upper MOSFET 50 is on or off, so is the right lower MOSFET 56, and input signals B and C are in phase, meaning that left lower MOSFET 52 and the right upper MOSFET 54 turn on and off at the same time. Accordingly, when input signals A and D turn on the left upper and right lower MOSFETs 50, 56, the left drivepoint H1 is coupled to the positive voltage rail 44 and the right drivepoint H2 is coupled to the negative voltage rail 46. When input signals B and C turn on the left lower and right upper MOSFETs 52, 54, the left drivepoint H1 is coupled to the negative voltage rail 46 and the right drivepoint H2 is coupled to the positive voltage rail 44. This allows the driver 14 to create a bipolar square wave 102 across the drivepoints H1, H2.

By making small delays in the rising edges of input signals A, B, C, and D, provision is made to ensure that MOSFETs 50 and 52, and MOSFETs 54 and 56, are not turned on together during the on/off transition.

The load will be driven efficiently if the input signals A, B, C and D have the same frequency as the frequency of the tuned load. With a highly tuned load, the harmonics of the bipolar pulsed voltage signal are filtered by the tuned load resulting in a sinusoidal load current at the fundamental frequency.

In order to limit switching transients that could damage the MOSFETs 50, 52, 54, and 56, low-inductance connections are used between the components of the driver 14, and low-impedance decoupling is used for the DC power supply voltage across the drivepoints H1, H2 during switching. Accordingly, to provide decoupling, the amplifier 10 features a set of low-frequency and high-frequency decoupling capacitors 48 coupled between the positive rail 44 and the negative rail 46 of the power supply. In addition, the MOSFETs 50, 52, 54, and 56 each have a respective low-inductance commutation diode 60, 62, 64, and 66 connected from source to drain to provide a path for transient pulses in load current. The commutation diodes 60, 62, 64, and 66 are also for carrying decaying load current during a normal shut-down, and in the event of drive failure.

The driver 14 shown in FIG. 3 provides variable output power to the tuned resonant load 12 through varying the pulse width of the bipolar square wave 102 across the drivepoints H1, H2. This is accomplished by varying the extent to which input signals A and B are in phase with input signals D and C, respectively. As outlined above, to operate at full power, the driver 14 requires input signals A and D to be in phase and input signal B and C to be in phase. However, in this embodiment, input signals C and D have an initial state of being 180 degrees out of phase with input signals B and A, respectively. Under these circumstances input signal C is completely out of phase with input signal B, and input signal A is completely out of phase with input signal D, meaning that the appropriate MOSFET 50, 52, 54, and 56 pairs are being driven completely out of sync and supply no current to the tuned resonant load 12.

Under the command of the controller 22, the input signals C and D may be delayed by up to one-half cycle. A full delay of one-half cycle would bring input signals C and D into phase with input signals B and A, respectively, resulting in maximum load current. The delay is adjustable between zero and one-half cycle and the extent of the delay determines the pulse width of the bipolar square wave 102 across the tuned load 12.

As may be seen in FIG. 4, by initially having the drive signals to each side of the driver 14 bridge out of phase and then applying a variable delay, the extent to which the two sides of the bridge correspond is variable, resulting in a bipolar square wave 102 with a variable pulse width. The pulse width of the bipolar square wave 102 corresponds to the amount of the delay. The pulse width of a positive pulse 104 of the bipolar square wave 102 is determined by the overlap of input signals A and D, since this will correspond to the time during which both the left upper MOSFET 50 and the right lower MOSFET 56 are both on. Similarly, the pulse width of a negative pulse 106 of the bipolar square wave 102 is determined by the overlap of input signals C and B.

As also shown in FIG. 4, the coil current 108 is filtered by the tuned load 12 to remove harmonics from the bipolar square wave 102 driving the tuned load 12, leaving a substantially sinusoidal coil current 108 at the fundamental frequency and similarly a sinusoidal capacitor voltage 110.

Note that the pulses 104, 106 of the bipolar square wave 102 are symmetrical and are centered within the half-cycles of the coil current 108 when the tuned resonant load 12 is correctly tuned. When the frequency of the input signals A, B, C, and D changes in response to a change in the FSK data signal, the resonant frequency of the tuned load 12 is adjusted so as to match the frequency of the input signals A, B, C, and D. In order to make this adjustment to the frequency of the tuned load 12, the edges of data bits are made coincident with zero-crossings of the capacitor voltage 110. In other words, bit transitions, i.e. changes in frequency, occur during zero-crossings of the capacitor voltage 110.

Referring still to FIG. 3, the controller 22 (FIG. 2) receives feedback information from the tuned load 12 through a current sensor 80 that measures the current flow in the tuned load 12 and through a voltage sensor 82 that measures the capacitor voltage. Accordingly, the controller 22 is able to recognize zero-crossings of the current and voltage. The capacitor voltage measured by the voltage sensor 82 in particular is input to the phase comparator 40 (FIG. 2) along with the master signal M to ensure that it leads the master signal M by 90 degrees. In other embodiments, the capacitor voltage may be sensed using other voltage sensors, such as, for example, a transformer coupled across the base capacitor 30.

Those skilled in the art will understand that, in this embodiment, the capacitor voltage is a proxy used to assess the extent to which the frequency and phase of the energy in the tuned load 12 correspond to the frequency and phase of the drive signal. Other mechanisms for measuring the current or voltage in the tuned load 12 in order to sense the frequency and phase of oscillation will be familiar to those of ordinary skill in the art.

Figure 5:
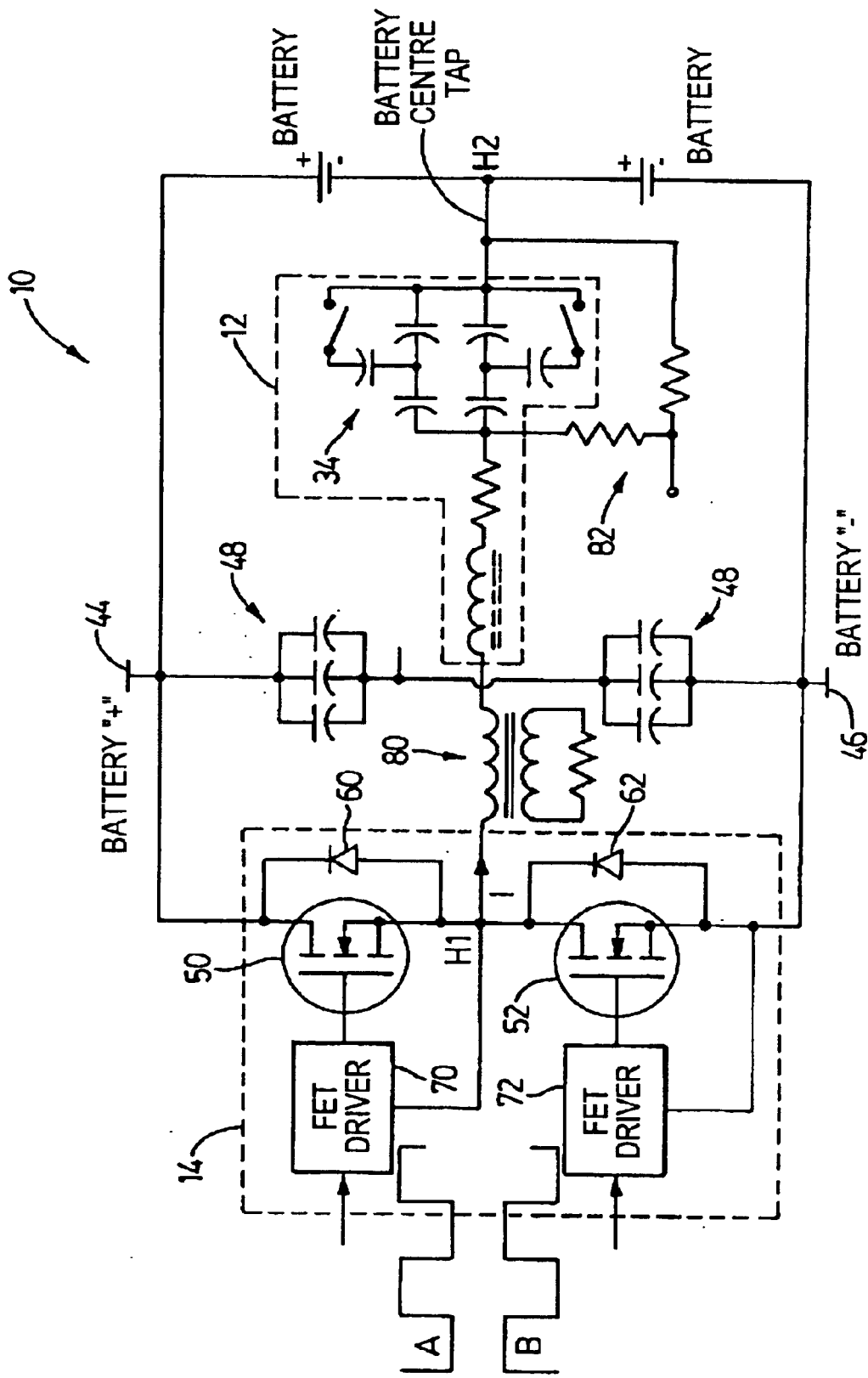
FIG. 5 shows a circuit for a half-bridge configuration of the dynamically tuned amplifier according to the present invention.

Reference is now made to FIG. 5, which shows a circuit for a half-bridge configuration of the dynamically tuned amplifier 10. In this embodiment, the driver 14 includes the left-side MOSFETs 50 and 52. Input signals A and B directly control the operation of the driver 14 and the application of power to the tuned load 12.

In order to obtain control over the output load current in the circuit of FIG. 5, direct control over the pulse width of A and B is necessary. The controller 22 symmetrically reduces the width of the purses of input signals A and B to create the desired bipolar drive voltage across the tuned load 12.

Figure 6:
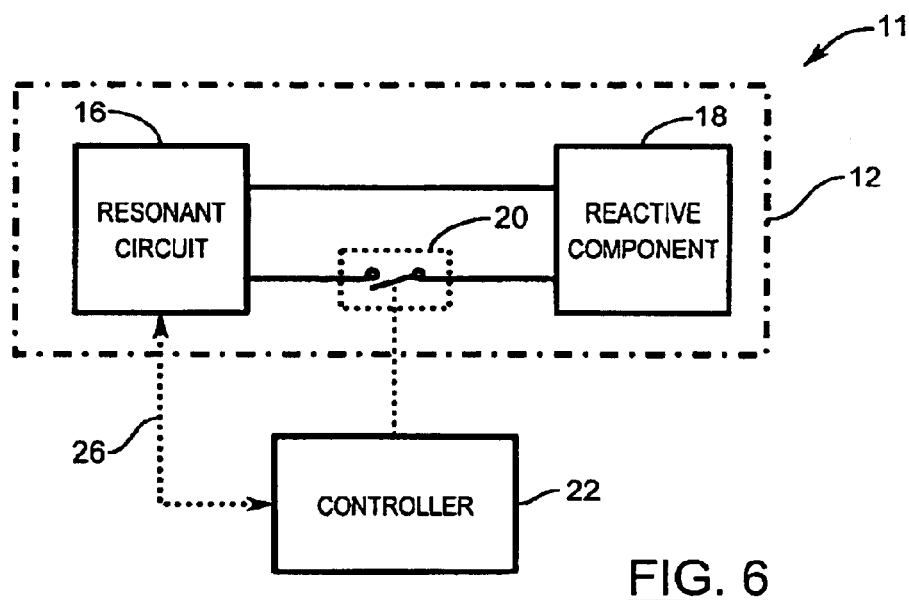
FIG. 6 shows, in block diagram form, an embodiment of a circuit for continuous reactive impedance control, according to the present invention.

Reference is now made to FIG. 6, which shows a block diagram of a circuit 11 for continuous variable reactive impedance control, according to the present invention. The circuit 11 may be employed in a dynamically-tuned amplifier according to the present invention to provide a tuned load with a continuously variable resonant frequency. The circuit 11 includes the tuned load 12 and the controller 22. As described above, the switch 20 controls whether the reactance 18 is coupled to the resonant circuit 16. The operation of the switch 20 is controlled by the controller 22. The controller 22 is coupled to the resonant circuit 16 through the feedback loop 26 to obtain data that may influence the opening or closing of the switch 20.

The reactance 18 is a reactive impedance that is selectively coupled to the resonant circuit 16 through the closure of the switch 20 as will be described in more detail below. When the reactance 18 is coupled to the resonant circuit 16, the impedance of the resonant circuit 16 is changed. For a resonant circuit 16 having a natural resonant frequency, such as an LC circuit, the addition of the reactive component 12 will change the natural resonant frequency.

Figure 7:
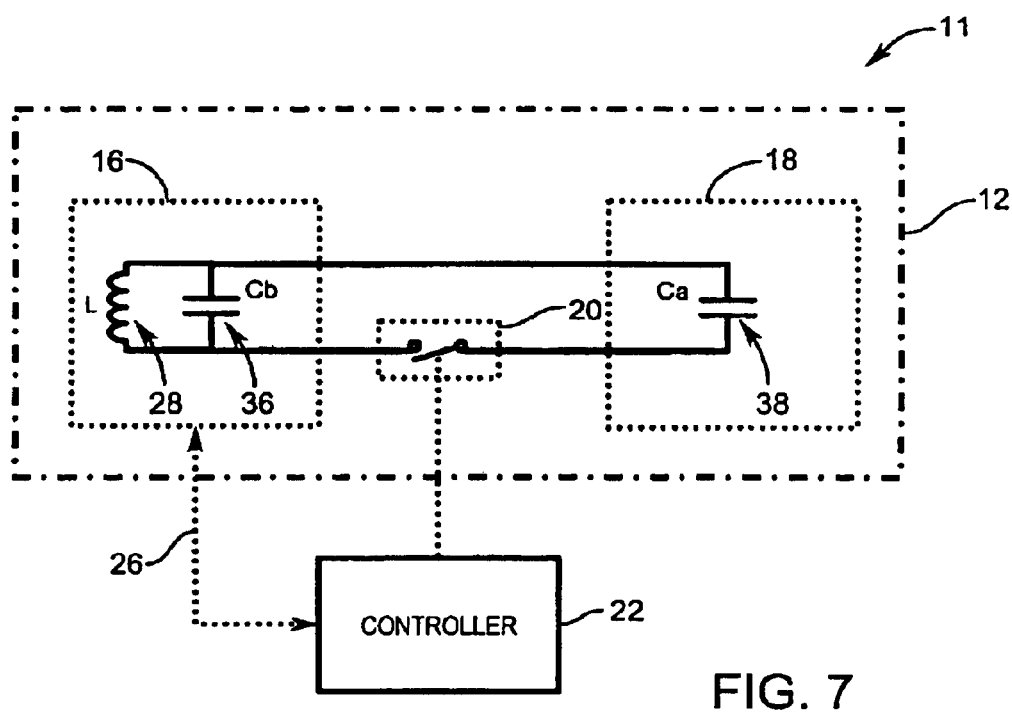
FIG. 7 shows a tank circuit with a variable reactive impedance, according to the present invention.

Reference is now made to FIG. 7, which shows an embodiment of the circuit 11 with a variable reactive impedance, according to the present invention. In the embodiment shown in FIG. 7, the resonant circuit 16 includes the inductive coil 28 coupled in parallel with a base capacitance 30. This configuration may be referred to as a "tank circuit". The inductive coil 28 and the base capacitance 30 set the natural resonant frequency of the resonant circuit 16.

The reactance 18 is a tuning capacitor 38. The tuning capacitor 38 is coupled in parallel with the base capacitance 30, through the switch 20. With the switch 20 open, the tuning capacitor 38 is disengaged from the circuit 11 and does not impact the resonant circuit 16. When the switch 20 is closed, the natural resonant frequency of the resonant circuit 16 is altered due to the additional capacitance. Through the operation of the switch 20, in accordance with the present invention, the circuit 11 provides continuously variable impedance and a corresponding continuously variable natural resonant frequency over a range of frequencies, as will be described below.

As will be apparent to those of ordinary skill in the art, various other passive components, including resistors, additional capacitors or additional inductors, or active components, including transistors, op-amps or other components may be added to the circuit 11 to customize it to a particular application requiring a particular impedance or other specific characteristics.

Figure 8:
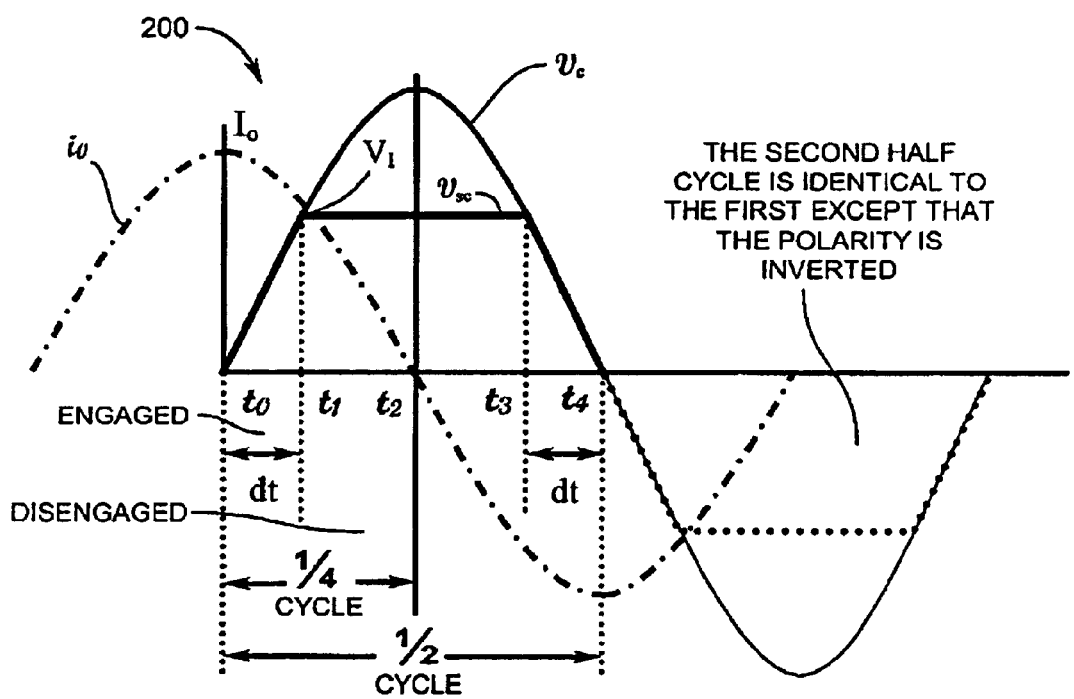
FIG. 8 shows current and voltage waveforms for an embodiment of a circuit for continuous reactive impedance control, according to the present invention.

The continuously variable adjustment of the impedance and frequency of a circuit according to the present invention is now illustrated with reference to FIG. 8, which shows current and voltage waveforms for the circuit 11 of FIG. 7. In particular, FIG. 8 shows a graph 200 of voltage and current versus time. The graph 200 includes a first voltage waveform $v_c$ for the base capacitance 30 (FIG. 7), a second voltage waveform $v_{sc}$ for the tuning capacitor 38 (FIG. 7) and a current waveform $i_0$ for the inductive coil 28 (FIG. 7). The waveforms $v_c$, $v_{sc}$ and $i_0$ are each approximately sinusoidal.

As the graph 200 shows, the tuning capacitor 38 is engaged in the circuit 11 (FIG. 7) between time $t_0$ and time $t_1$, for a duration dt. In other words, the switch 20 (FIG. 7) is closed between time $t_0$ and time $t_1$. The switch 20 is then opened at time $t_1$, disengaging the tuning capacitor 38 from time $t_1$ to time $t_2$. It remains disengaged until time $t_3$, when it is re-engaged for the duration of the half-cycle which ends at time $t_4$. The duration dt of time $t_1$–$t_0$ is the same as the duration of time $t_4$–$t_3$. In other words, the switch 20 is opened at time $t_1$ and closed at time $t_3$, removing the tuning capacitor 38 from the circuit 11 for the duration $t_3$–$t_1$, centered within the half-cycle.

Beginning at time $t_0$, the current through the inductive coil 28 is at a maximum and the voltage of the capacitors 24 and 26 is at zero. The base capacitance 30 and the tuning capacitor 38 begin to accumulate charge, as reflected in the voltage waveforms $v_c$ and $v_{sc}$, and the current in the inductive coil 28 begins to decrease, as shown in the current waveform $i_0$. After duration dt, at time $t_1$, the switch 20 is opened, disengaging tuning capacitor 38 from the circuit 11. Accordingly, it accumulates no further charge and maintains its voltage potential, as shown by the second voltage waveform $v_{sc}$. The voltage of the base capacitance 30 continues to increase in substantially sinusoidal fashion, reaching a peak at time $t_2$. This corresponds with the zero-crossing of the current waveform $i_0$, indicating zero current in the inductive coil 28.

After time $t_2$, the voltage of the base capacitance 30 begins to decrease as shown in the first voltage waveform $v_c$. At time $t_3$, the voltage of the base capacitance 30 matches the voltage of the tuning capacitor 38, at which point the tuning capacitor 38 is re-engaged in the circuit 10. From time $t_3$ to time $t_4$, the two capacitors 24 and 26 discharge together. At time $t_4$, both capacitors 24 and 26 have fully discharged, as shown by the zero-crossing of the two voltage waveforms $v_c$ and $v_{sc}$. The duration dt is the same between times $t_0$ and $t_1$ and between times $t_3$ and $t_4$.

The time $t_3$ may be calculated in order to determine when to switch the tuning capacitor 38 back into the resonant circuit 16, or the voltages on the base capacitance 30 and the tuning capacitor 38 may be compared and the tuning capacitor 38 may be re-engaged when the voltages are identical, which will occur at time $t_3$. If the tuning capacitor 38 is re-engaged on the basis of a voltage comparison, then in one embodiment it may be done through sensing the voltage on each capacitor and using a comparator to trigger the switch 20 to close. Other possible methods will be understood by those skilled in the art.

Following time $t_4$, the switch 20 remains engaged and the process repeats itself, but with reversed polarity. The switch 20 is closed for a duration dt at the beginning and at the end of the second half cycle, and open in between those durations.

By varying the duration dt, and therefore the times $t_1$ and $t_3$, the resulting oscillation frequency of the circuit may be altered. This is further illustrated with reference to FIG. 9, which shows a graph 210 of current and voltage waveforms for the circuit 11 (FIG. 7).

Figure 9:
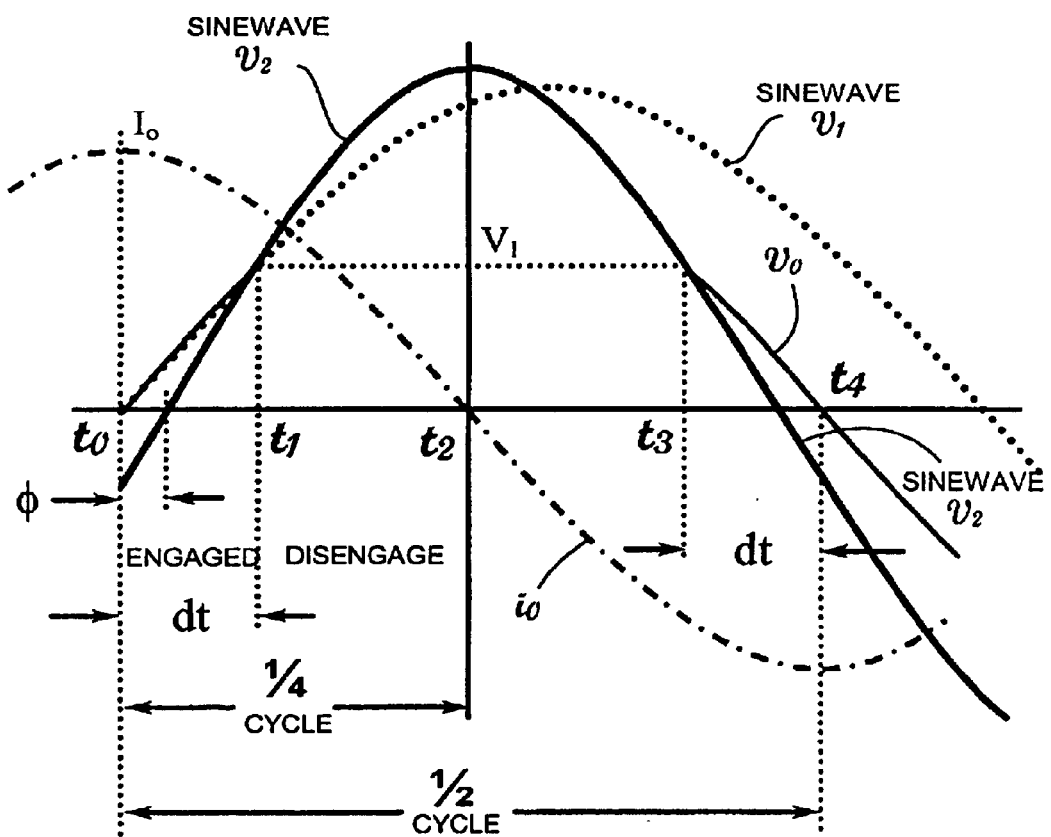
FIG. 9 shows further current and voltage waveforms for an embodiment of a circuit for continuous reactive impedance control, according to the present invention.

FIG. 9 shows a waveform for the voltage $v_0$ across the inductive coil 28. The current through the inductor is depicted as the waveform $i_0$. Also shown are two sinusoids: a first voltage sinewave $v_1$ and a second voltage sinewave $v_2$. Sinewave $v_1$ varies at the natural resonant frequency of the circuit 11 (FIG. 7) when the tuning capacitor 38 (FIG. 7) is engaged. Sinewave $v_2$ varies at the natural resonant frequency of the circuit 11 when the tuning capacitor 38 is not engaged. Note that sinewave $v_2$ is depicted with a phase shift φ, for reasons which will become apparent from the following description.

As described above, the circuit 11 begins each half-cycle of its oscillation frequency with the switch 20 (FIG. 7) closed and, thus, the tuning capacitor 38 engaged. Under these circumstances, the voltage $v_0$ across the inductive coil 28 (FIG. 7) changes in accordance with sinewave $v_1$, which corresponds to the natural resonant frequency of the circuit 11 when the inductive coil 28 is in parallel with the base capacitance 30 (FIG. 7) and in parallel with the tuning capacitor 38.

At time $t_1$, with the voltage $v_0$ at a magnitude of $V_1$, the tuning capacitor 38 is switched out of the circuit 11, thereby changing the natural resonant frequency of the circuit 11. The resonant frequency of the circuit 11 is now determined by the inductive coil 28 in parallel with the base capacitance 30 alone. This frequency is reflected in sinewave $v_2$. At time $t_1$, the voltage $v_0$ across the inductive coil 28 stops following sinewave $v_1$ and starts changing in accordance with sinewave $v_2$. As can be seen in FIG. 9, sinewave $v_2$ has a higher frequency than sinewave $v_1$. The phase shift $\phi$ shown in sinewave $v_2$ is necessary to ensure the condition that sinewave $v_2$ has a magnitude of $V_1$ at time $t_1$.

At time $t_3$, the tuning capacitor 38 is switched back into the circuit 11, changing the natural resonant frequency of the circuit 11 back to the lower frequency of sinewave $v_1$. Accordingly, from $t_3$ to $t_4$ the voltage $v_0$ across the inductive coil 28 changes at a rate described by sinewave $v_1$. In FIG. 9, the voltage $v_0$ can be seen deviating from sinewave $v_2$ after time $t_3$.

With time $t_1$ set between $t_0$ and $t_2$, the frequency of the voltage $v_0$ will be neither the frequency of sinewave $v_1$ nor the frequency of sinewave $v_2$, but rather a frequency in between. The frequency of the voltage $v_0$ may be varied by varying the duration dt during which the tuning capacitor 38 is engaged in the circuit. To reduce the impact of the tuning capacitor 38 and thereby increase the frequency of the voltage $v_0$ closer to the frequency of sinewave $v_2$, the duration dt is decreased. Conversely, to lower the frequency of the voltage $v_0$ closer to the frequency of sinewave $v_1$, the duration dt is increased. By providing for continuous variability of dt, the circuit 11 has a continuously variable frequency within the range between the frequency of sinewave $v_1$ and the frequency of sinewave $v_2$.

The foregoing embodiment may also be illustrated mathematically. For example, the sinewave $v_1$ may be described by the equation:

$$v_1(t) = A_1 \sin(\omega_1 t) \quad (1)$$

In the above equation (1), $A_1$ is the magnitude and $\omega_1$ is the frequency. The magnitude $A_1$ is the maximum voltage of the sinewave. This maximum is given by $V_{max} = I_{max} Z$, which in the present circuit 11 may be expressed as $I_0 \omega_1 L$. The frequency $\omega_1$ is the natural resonant frequency of the circuit 11 with the tuning capacitor 38 included, which is described by:

$$\omega_1 = \frac{1}{\sqrt{L(C_a + C_b)}} \quad (2)$$

The other sinewave $v_2$ may be described by the equation:

$$v_2(t) = A_2 \sin(\omega_2 t + \phi) \quad (3)$$

The frequency $\omega_2$ is given by the natural resonant frequency of the circuit 10 with the tuning capacitor 38 disengaged, which is described by the equation:

$$\omega_2 = \frac{1}{\sqrt{LC_b}} \quad (4)$$

The maximum magnitude $A_2$ of sinewave $v_2$ can be determined from the assumption of conservation of energy. The total energy in the circuit 10 at time $t_0$ is due to the maximum current $I_0$ in the inductor L. When the tuning capacitor 38 is switched out of the circuit 10 at time $t_1$ it has a specific quantity of energy stored in it. At time $t_2$, the total energy that had been in the inductor at time $t_0$ is now contained in the two capacitors 24 and 26. The voltage on the base capacitance 30 at time $t_2$ is the maximum voltage, or the magnitude, $A_2$. From this we can equate the total energy at time $t_0$ to the total energy at time $t_2$ in the expression:

$$\tfrac{1}{2}LI_0^2 = \tfrac{1}{2}C_a v_1(t_1)^2 + \tfrac{1}{2}C_b v_2(t_2)^2 \quad (5)$$

$$A_2 = v_2(t_2) = \sqrt{\frac{LI_0^2 - C_a v_1(t_1)^2}{C_b}} \quad (6)$$

At time $t_1$ it is known that $v_1(t_1) = v_2(t_1) = A_2 \sin(\omega_2 t_1 + \phi)$. Therefore, the phase shift $\phi$ may be expressed as:

$$\varphi = \arcsin\left(\frac{v_1(t_1)}{A_2}\right) - \omega_2 t_1 \quad (7)$$

It is also known that at time $t_2$, $v_2(t)$ is at a maximum. Therefore, the sinusoidal component of $v_2(t)$ is equal to 1, meaning that $\sin(\omega_2 t_2 + \phi) = \sin(\pi/2) = 1$. Therefore $t_2$ may be expressed in terms of $\omega_2$ and $\phi$. Of course, the time $t_2$ is related to the oscillation frequency of the circuit $f_c$.

Using the above expressions, the oscillation frequency $f_c$ can be related entirely to L, $C_a$, $C_b$ and $t_1$. If the values of L, $C_a$, and $C_b$ are known, then the oscillation frequency $f_c$ produced by a particular $t_1$ may be calculated. Moreover, to achieve a particular oscillation frequency $f_c$, the appropriate time $t_1$, and thus the duration dt, may be calculated.

Figure 10:
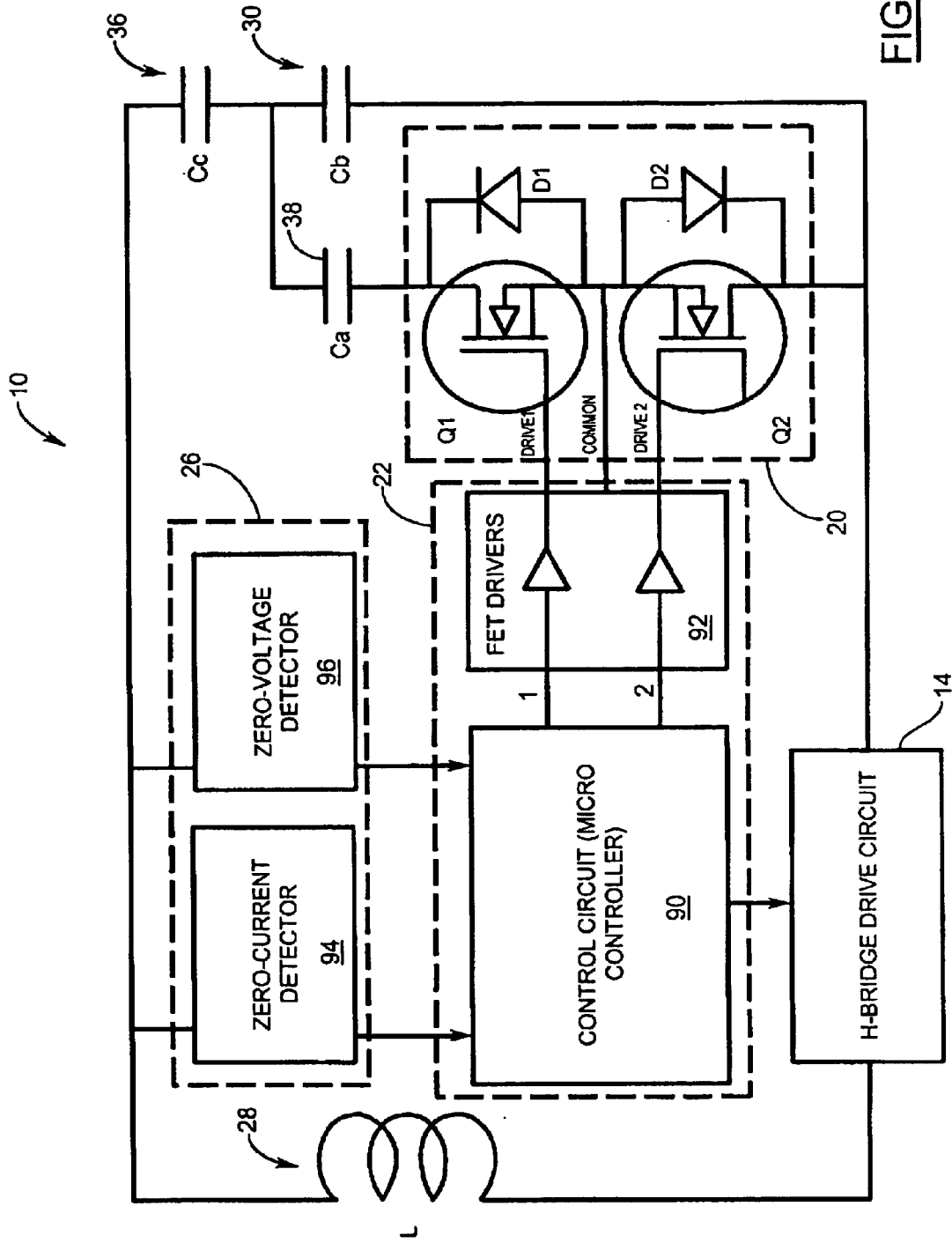
FIG. 10 shows, in block diagram form, an embodiment of a dynamically tuned amplifier, according to the present invention.

Reference is now made to FIG. 10 which shows, in block diagram form, an embodiment of the dynamically tuned amplifier 10, according to the present invention. As opposed to the tank circuit 11 shown in FIG. 7, which featured the inductive coil 28 and base capacitance 30 in parallel, the amplifier 10 shown in FIG. 10 features the inductive coil 28 and the base capacitance 30 coupled in series. The tuning capacitor 38 is coupled in parallel with the base capacitance 30 through the switch 20. The second capacitor 26 is coupled in series between the base capacitance 30 and the inductive coil 28. The values of the three capacitors 24, 25, 26 and of the inductive coil 28, set the range of adjustability of the natural resonant frequency of the amplifier 10 and the acceptable voltage and current values for the circuit. The addition of, and size of, the second capacitor 26 may be necessitated by the current or voltage rating of the switch 20.

The switch 20 is controlled by the controller 22, which is coupled to the feedback loop 26. The switch 20 comprises a pair of FETs Q1 and Q2 having their sources connected together. The drain of the first FET Q1 is connected to the tuning capacitor 38 and the drain of the second FET Q2 is connected to the base capacitance 30. The gates of the FETs Q1 and Q2 are coupled to the controller 22. The switch 20 further includes first and second diodes D1 and D2. The first diode D1 is coupled across the first FET Q1 and the second diode is coupled across the second FET Q2. The anodes of the diodes D1 and D2 are connected to the sources of the FETs Q1 and Q2. The cathode of first diode D1 is connected to the drain of first FET Q1 and the cathode of second diode D2 is connected to the drain of second FET Q2.

At a voltage zero-crossing, the switch 20 is in a closed state, meaning that both FETs Q1 and Q2 are switched on.

This requires that the controller 22 provide a signal to the gates of the FETs Q1 and Q2. After the duration dt, at time $t_1$, one of the FETs Q1 or Q2 is switched off by the controller 22. Which FET Q1 or Q2 is switched off depends upon the polarity of the voltage waveform. Diodes D1 and D2 may conduct when their respective FET Q1 or Q2 has been switched off if the voltage across the FET Q1 or Q2 from drain to source is back biased. In other words, once the voltage on the base capacitance 30 has discharged to a level equal to or just less than the voltage on the tuning capacitor 38, the diode D1 or D2, depending on the polarity, permits the tuning capacitor 38 to begin discharging together with the base capacitance 30. Accordingly, in this embodiment, the switch 20 re-engages the tuning capacitor 38 at the appropriate time $t_3$. The switch 20 remains closed for a duration dt at which point a voltage zero-crossing will occur, and the process will repeat. The effects of the diode voltage drop may be ignored in high current and high voltage applications. Although many FETs, and MOSFETs in particular, integrally feature diodes like diodes D1 and D2 by virtue of the physical construction of the FET, the additional diodes D1 and D2 are added in the present embodiment because they are of better quality and reliability than the internal diodes of a FET. In lower power application, it may be possible to rely solely upon the internal diodes of the FETs.

The controller 22 includes a microcontroller 90 and a set of FET drivers 92. The FET drivers 92 are coupled to the gates of the FETs Q1 and Q2 and provide the signals required to turn the FETs Q1 and Q2 on or off. The FET drivers 92 are controlled by the microcontroller 90.

The microcontroller 90 determines when to open and close the switch 20. In other words, the microcontroller 90 determines the duration dt during which the switch 20 is to remain closed at the beginning and end of each half-cycle of the oscillation frequency of the amplifier 10. As outlined above, in this embodiment, the microcontroller 90 causes the switch 20 to open after the expiry of the duration dt following a zero-crossing of the voltage and the switch 20 closes itself at a time dt before the end of the next zero-crossing.

Coupled to the microcontroller 90 through the feedback loop 26 is a zero-current detector 94 and a zero-voltage detector 96. The zero-voltage detector 96 provides the microcontroller 90 with a signal indicating the zero-crossing points and polarity of the voltage in the amplifier 10. From this information, the microcontroller 90 can identify the time $t_0$ and the time $t_4$, and therefore the oscillation frequency of the amplifier 10. The microcontroller 90 may then calculate the time $t_1$ and the time $t_3$ at which to open and close the switch 20, based upon the duration dt.

The zero-current detector 94 provides the microcontroller 90 with a signal indicating the zero-crossing points and polarity of the current in the inductive coil 28. From this data, the microcontroller 90 can assess the extent to which the voltage and current are 90° out of phase, which represents the desired phase shift in a resonant circuit.

The microcontroller 90 also controls the driver 14 that is coupled to the inductive coil 28 and the base capacitance 30. As described above with reference to FIGS. 1 through 5, the driver 14 may be an H-bridge configuration. The driver 14 drives oscillation of the amplifier 10 by supplying a drive signal to the inductive coil 28 and base capacitance 30. The drive signal may be an FSK square wave that varies in frequency in accordance with the information encoded therein. The microcontroller 90 adapts the resonant phase and frequency of the amplifier 10 to so as to match the phase and frequency of the drive signal and thereby improve the efficiency of the amplifier 10.

The efficiency of the amplifier 10 will depend upon the match between the resonant frequency of the tuned load and the frequency of the driver signal with which it is being driven. The microcontoller 90 can determine the extent of such a match through a phase comparison between the voltage and the current of the amplifier 10, as provided by the feedback loop 26. It may then adjust the impedance, and thus the resonant frequency, of the amplifier 10 through adjusting the duration dt in order to more accurately match the resonant frequency to the drive frequency.

An amplifier that is set to be driven at a predetermined frequency and is optimized to operate at that frequency may experience inefficiencies if there is any drift in the components, such as the inductance. Fine-tuning of the amplifier 10 through alteration of the duration dt can re-establish the efficiency of the amplifier 10. This may find application in antennas, amplifiers or other oscillating circuits. Such a circuit or method may also be used with existing systems to re-tune and optimize their performance.

The microcontroller 90 is suitably programmed to execute a program in firmware to perform the functions and calculations described herein. The programming will be within the understanding of those ordinarily skilled in the art of microcontroller programming.

The microcontroller 90 may include a memory having one or more preset durations dt corresponding to present oscillation frequencies.

The present invention may be incorporated in a transmission system, such as a magnetic inductive transmitter, receiver or transceiver. Such a system may include an antenna and other elements of the transmitter, receiver or transceiver as a part of the oscillating circuit.

As will be understood by those of ordinary skill in the art, the present invention is not limited to the specific embodiments described herein. The invention may be implemented using discrete or integrated components and may include software, hardware and/or firmware. The invention, or portions thereof, may be implemented using analog or digital components, including the switch control.

The present invention may be embodied in other specific forms without departing from the spirit or essential characteristics thereof. Certain adaptations and modifications of the invention will be obvious to those skilled in the art. Therefore, the above discussed embodiments are considered to be illustrative and not restrictive, the scope of the invention being indicated by the appended claims rather than the foregoing description, and all changes which come within the meaning and range of Equivalency of the claims are therefore intended to be embraced therein.

What is claimed is:

1. A circuit, comprising:
    a tunable resonant load containing a variable load energy having a load phase;
    a driver coupled across said tunable resonant load to apply a variable drive signal having a drive frequency and phase to said tunable resonant load to supply said variable load energy;
    a controller coupled to said tunable resonant load and coupled to said driver, said controller including a first component for controlling said drive phase of said drive signal, a second component for tuning said tunable resonant load, and a third component for setting said variable load energy; and
    a feedback loop coupled between said tunable resonant load and said controller, said feedback loop generating an error signal in response to a phase deviation between said drive phase and said load phase;

wherein, in response to said error signal, said second component generates a tuning signal for tuning said tunable resonant load.

2. The circuit claimed in claim 1, wherein said tunable resonant load includes an inductor, a base capacitor and a tuning capacitor.

3. The circuit claimed in claim 2, wherein said load energy oscillates at a load frequency and said tuning capacitor is coupled to said inductor and said base capacitor through a switch, said switch being responsive to said tuning signal.

4. The circuit claimed in claim 3, wherein said tuning signal includes a disengagement portion for opening said switch during the first half of each half-cycle of said load frequency, and an engagement portion for closing said switch during the second half of each half-cycle of said load frequency.

5. The circuit claimed in claim 4, wherein disengagement portion and said engagement portion are separated by a duration, and wherein said second component varies said duration to tune said tunable resonant load.

6. The circuit claimed in claim 1, wherein said feedback loop receives a load energy signal from said tunable resonant load and receives a master signal from said controller, said master signal having a predetermined phase relationship with said driving signal, and wherein said feedback loop generates said error signal in response to a difference in a phase relationship between said load energy signal and said master signal.

7. The circuit claimed in claim 6, wherein said feedback loop includes a phase comparator and said error signal comprises a phase error signal.

8. The circuit claimed in claim 7, wherein said feedback loop further includes an integrator and a gain block for producing said phase error signal.

9. The circuit claimed in claim 6, wherein said load energy signal comprises a capacitor voltage signal.

10. The circuit claimed in claim 9, wherein said error signal is a signed error signal reflecting a desired phase difference between said capacitor voltage signal and said master signal, and where said desired phase difference comprises about ninety degrees.

11. The circuit claimed in claim 6, wherein said load energy signal comprises a load current signal.

12. The circuit claimed in claim 1, wherein said drive signal comprises a bipolar pulsed voltage signal.

13. The circuit claimed in claim 12, wherein said first component includes a pulse width modulation component for controlling the effective pulse width of pulses of said bipolar pulsed voltage signal, thereby controlling the energy transferred to said tunable resonant load.

14. The circuit claimed in claim 13, wherein said driver includes a half-bridge configured driver having two driver switches coupled in series between a positive voltage and a negative voltage and having a drivepoint coupled to said tunable resonant load for providing said bipolar pulsed voltage signal.

15. The circuit claimed in claim 13, wherein said driver includes a full H-bridge configured driver having four driver switches coupled between a positive voltage and a negative voltage and having drivepoints coupled across said tunable resonant load for providing said bipolar pulsed voltage signal.

16. The circuit claimed in claim 15, wherein said four driver switches operate in response to four respective FSK switch signals generated by said controller, and wherein the timing of said FSK switch signals determines said driving frequency and the effective pulse width of said bipolar pulsed voltage signal.

17. The circuit claimed in claim 12, wherein said tuned resonant load includes a substantially sinusoidal load current and wherein each pulse of said bipolar pulsed voltage signal is centered within a respective half-cycle of said load current.

18. The circuit claimed in claim 1, wherein said controller includes a memory, and wherein said memory includes at least one predetermined tuning signal setting corresponding to at least one predetermined drive signal setting.

19. The circuit claimed in claim 1, wherein said tunable resonant load includes a tuning capacitor in series with a switch, and wherein said switch operates in response to said tuning signal.

20. A method of driving a tunable resonant load with an amplifier using a drive signal having a driving phase, the tunable resonant load containing a load energy having a load phase, the method including the steps of:
(a) applying the drive signal to said tunable resonant load;
(b) measuring a phase difference between said drive phase of said drive signal and said load phase of said load energy;
(c) generating an error signal based upon said phase difference; and
(d) tuning said tunable resonant load in response to said error signal.

21. The method claimed in claim 20, wherein said load energy oscillates at a load frequency and said steps are repeated every cycle of said load frequency.

22. The method claimed in claim 20, wherein said load energy oscillates at a load frequency, wherein said tunable resonant load includes an inductive component, a capacitive component, and a reactance, said reactance being coupled in series with a switch, and wherein said step of tuning includes adjusting a time at which said switch opens during a first half of each half-cycle of said load frequency and a time at which said switch closes during a second half of each half-cycle of said load frequency.

23. The method claimed in claim 20, wherein said step of generating includes comparing said phase difference with a desired phase deviation and generating a signed phase error signal based upon said step of comparing.

24. The method claimed in claim 23, wherein said step of measuring includes receiving a load energy signal from said tunable resonant load and receiving a master signal from a controller, said master signal having a predetermined phase relationship with said drives signal, and comparing the load phase of said load energy signal to the phase of said master signal to determine said phase difference.

25. The method claimed in claim 24, wherein said load energy signal is a capacitor voltage signal.

26. The method claimed in claim 24, wherein said load energy signal is a load current signal.

27. The method claimed in claim 20, wherein said drive signal includes a bipolar pulsed voltage signal.

28. The method claimed in claim 27, wherein said step of applying includes a step of setting the effective pulse width of said bipolar pulsed voltage signal, thereby controlling the energy transferred to said tunable resonant load.

29. The method claimed in claim 20, wherein said drive signal includes an FSK modulated signal having bit transitions, and wherein the amplifier includes a memory for storing predetermined tuning signal settings corresponding to predetermined drive signals, and wherein, at bit transitions, said step of dynamically tuning includes tuning said tunable resonant load based upon one of said predetermined tuning signal settings, and further including a step of fine tuning during a bit duration.

30. An apparatus, comprising:

a resonant load having a resonant frequency and including tuning means for continuous tuning of said resonant frequency, said resonant load containing a load energy having a load phase;

drive means for driving said tunable resonant load with a drive signal having a drive phase;

control means coupled to said tunable resonant load and coupled to said drive means, for controlling said drive phase of said drive signal and for controlling said tuning means; and feedback means coupled between said tunable resonant load and said control means, said feedback means generating an error signal in response to a phase deviation between said drive phase and said load phase; wherein said control means controls said tuning means in response to said error signal.

31. The apparatus claimed in claim 30, wherein said control means generates a tuning signal for controlling said tuning means, and wherein said tuning means includes a switch means for switching a reactive component into said resonant load.

32. The apparatus claimed in claim 31, wherein said load energy oscillates at a load frequency and wherein switch means switches said reactive component into said resonant load for a portion of each half cycle of said load frequency.

33. The apparatus claimed in claim 32, wherein said control means determines the duration of said portion of each half cycle, thereby controlling said resonant frequency.

34. The apparatus claimed in claim 30, said control means controls said tuning means to match said resonant frequency to a drive frequency of said drive signal.

* * * * *